US012353132B2

(12) United States Patent
Chen

(10) Patent No.: US 12,353,132 B2
(45) Date of Patent: Jul. 8, 2025

(54) METALLIC PHOTORESIST PATTERNING AND DEFECT IMPROVEMENT

(71) Applicant: Taiwan Semiconductor Manufacturing Co., Ltd., Hsinchu (TW)

(72) Inventor: Chien-Chih Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 66 days.

(21) Appl. No.: 18/447,920

(22) Filed: Aug. 10, 2023

(65) Prior Publication Data

US 2023/0393475 A1 Dec. 7, 2023

Related U.S. Application Data

(62) Division of application No. 17/374,839, filed on Jul. 13, 2021, now Pat. No. 12,306,536.

(60) Provisional application No. 63/116,636, filed on Nov. 20, 2020.

(51) Int. Cl.
G03F 7/09 (2006.01)
H01L 21/027 (2006.01)

(52) U.S. Cl.
CPC .............. G03F 7/094 (2013.01); G03F 7/091 (2013.01); H01L 21/0276 (2013.01)

(58) Field of Classification Search
CPC ........ G03F 7/094; G03F 7/091; G03F 7/0042; H01L 21/0276
See application file for complete search history.

(56) References Cited

U.S. PATENT DOCUMENTS

| | | | |
|---|---|---|---|
| 5,851,722 A | 12/1998 | Coppens et al. | |
| 6,183,935 B1 | 2/2001 | Hanabata et al. | |
| 2003/0235784 A1* | 12/2003 | Jung | G03F 7/091 430/905 |
| 2005/0267277 A1 | 12/2005 | Takahama et al. | |
| 2006/0263702 A1 | 11/2006 | Yamashita et al. | |
| 2008/0008955 A1* | 1/2008 | Brodsky | G03F 7/091 430/270.1 |
| 2009/0163693 A1 | 6/2009 | Kim | |
| 2009/0253077 A1 | 10/2009 | Shirai et al. | |
| 2010/0009132 A1 | 1/2010 | Cheng et al. | |

(Continued)

FOREIGN PATENT DOCUMENTS

WO 2005081065 A1 9/2005

OTHER PUBLICATIONS

Acs, "Dimethyl sulfoxide," Molecule of the Week Archive, Sep. 2021. (3 pages).

(Continued)

Primary Examiner — Jonathan Johnson
Assistant Examiner — Alexander N. Lee
(74) Attorney, Agent, or Firm — Seed IP Law Group LLP

(57) ABSTRACT

A multilayer structure for lithography patterning is provided. The multilayer structure includes a substrate, a bottom anti-reflective coating (BARC) layer over the substrate, and a photoresist layer over the BARC layer. The BARC layer includes a polymer and a hydrolysis promoting agent. The photoresist layer includes an organometallic dimer obtained by partial hydrolysis of a precursor organometallic compound comprising hydrolysable ligands.

20 Claims, 13 Drawing Sheets

(56) References Cited

U.S. PATENT DOCUMENTS

| | | |
|---|---|---|
| 2010/0075248 A1 | 3/2010 | Mukhopadhyay et al. |
| 2015/0056542 A1 | 2/2015 | Meyers et al. |
| 2015/0316849 A1 | 11/2015 | Kanno et al. |
| 2016/0116839 A1 | 4/2016 | Meyers et al. |
| 2017/0184961 A1 | 6/2017 | Nakagawa et al. |
| 2019/0044067 A1 | 2/2019 | Tan et al. |
| 2019/0094691 A1 | 3/2019 | Kasahara |

OTHER PUBLICATIONS

Britannica, "Esterification," retrieved Mar. 2023, URL = https://www.britannica.com/science/alcohol/Esterification. (1 page).

Pubchem, "Cumene," Compound Summary, modified Apr. 2023. (67 pages).

Pubchem, "In situ DMSO hydration measurements of HTS compound libraries," *Combinatorial Chemistry & High Throughput Screening* 8(6):489-498, Sep. 2005. (Abstract) (2 pages).

Verbit et al., "The benzene ring as an optically active chromophore—II," Tetrahedron 22(3):753-760, 1966. (8 pages).

Llorente et al., "Chemical analysis of vinyl-crosslinked poly(dimethylsiloxane) model networks and use of the resulting structural information in the interpretation of their elastomeric properties," Journal of Polymer Science: Polymer Physics Edition 18(11):2263-2270, Nov. 1980. (8 pages).

Research and Markets, "Adhesion Promoter (Silane, Maleic Anhydride, Chlorinated Polyolefins, Titanate & Zirconate, Others) Market Report 2016—Global Forecast to 2021—Research and Markets," Apr. 22, 2016, URL=https://www.businesswire.com/news/home/20160422005671/en/, retrieved on Oct. 12, 2023. (2 pages)—retrieved date taken from the date of the 892.

* cited by examiner

METALLIC PHOTORESIST PATTERNING AND DEFECT IMPROVEMENT

PRIORITY CLAIM AND CROSS-REFERENCE

This application is a divisional application of U.S. patent application Ser. No. 17/374,839, filed Jul. 13, 2021, which claims the benefit of U.S. Provisional Patent Application No. 63/116,636, filed Nov. 20, 2020, the disclosures of which are incorporated by reference herein in their entireties.

BACKGROUND

Semiconductor devices are used in a variety of electronic applications, such as personal computers, cell phones, digital cameras, and other electronic equipment. Semiconductor devices are fabricated by sequentially depositing dielectric layers, conductive layers, and semiconductor layers over a semiconductor substrate, and patterning the various material layers using photolithography. In a photolithography process, a photoresist is deposited over a substrate and is exposed to a radiation such as extreme ultraviolet (EUV) ray. The radiation exposure causes a chemical reaction in the exposed areas of the photoresist and creates a latent image corresponding to the mask pattern in the photoresist. The photoresist is next developed in a developer to remove either the exposed portions of the photoresist for a positive photoresist or the unexposed portions of the photoresist for a negative photoresist. The patterned photoresist is then used as an etch mask in subsequent etching processes in forming integrated circuits (ICs). Advancement in lithography is generally desirable to meet the demand of the continued semiconductor miniaturization.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
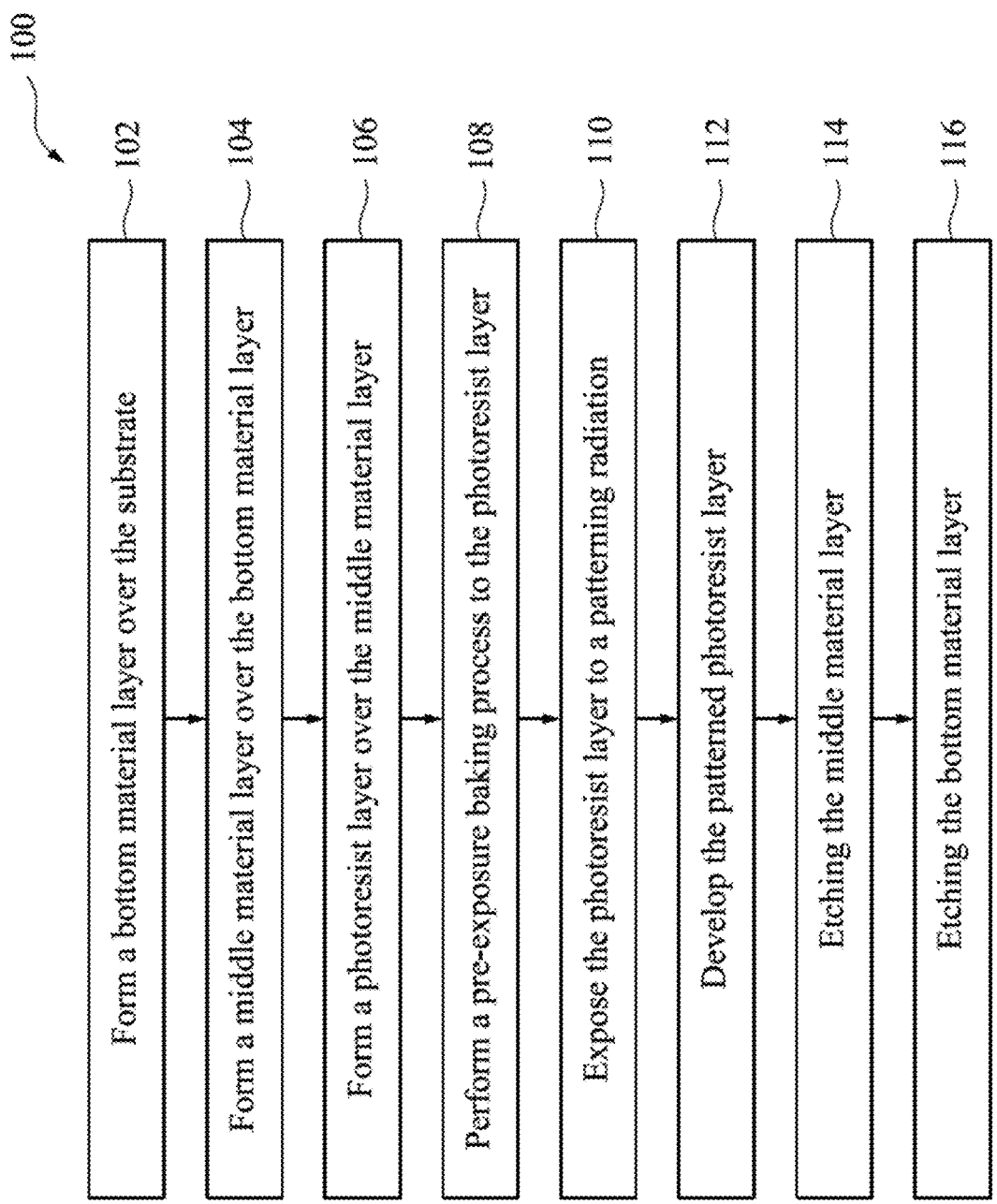
FIG. 1 is a flow chart of a method for fabricating a semiconductor structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. System may be otherwise oriented (rotated 90 degrees or at other orientations) and the spatially relative descriptors used herein may likewise be interpreted accordingly.

When describing the compounds, compositions, methods and processes of the present disclosure, the following terms have the following meanings, unless otherwise indicated.

As described herein, the compounds disclosed herein may optionally be substituted with one or more substituents, such as illustrated generally below, or as exemplified by particular classes, subclasses, and species of the present disclosure. It will be appreciated that the phrase "optionally substituted" is used interchangeably with the phrase "substituted or unsubstituted". In general, the term "substituted" whether proceeded by the term "optionally" or not, refers to the replacement of one or more hydrogen radicals in a given structure with the radical of a specified substituent. Unless otherwise indicated, an optionally substituted group may have a substituent at each substitutable position of the group. When more than one position in a given structure can be substituted with more than one substituent selected from a specified group, the substituent may be either the same or different at each position.

"Alkyl" refers to a straight or branched hydrocarbon chain group consisting solely of carbon and hydrogen atoms, containing no unsaturation, having from one to twelve carbon atoms ($C_1$-$C_{12}$ alkyl), one to eight carbon atoms ($C_1$-$C_8$ alkyl) or one to six carbon atoms ($C_1$-$C_6$ alkyl), and which is attached to the rest of the molecule by a single bond, e.g., methyl, ethyl, n-propyl, 1-methylethyl (iso-propyl), n-butyl, n-pentyl, 1,1-dimethylethyl (t-butyl), 3-methylhexyl, 2-methylhexyl, and the like. Unless stated otherwise specifically in the specification, alkyl groups are optionally substituted.

"Alkylene" or "alkylene chain" refers to a straight or branched divalent hydrocarbon chain linking the rest of the molecule to a radical group, consisting solely of carbon and hydrogen, containing no unsaturation, and having from one to twelve carbon atoms, e.g., methylene, ethylene, propylene, n-butylene, ethenylene, propenylene, n-butenylene, propynylene, n-butynylene, and the like. The alkylene chain is attached to the rest of the molecule through a single bond and to the radical group through a single bond. The points of attachment of the alkylene chain to the rest of the molecule and to the radical group can be through one carbon or any two carbons within the chain. Unless stated otherwise specifically in the specification, alkylene is optionally substituted.

"Alkenylene" or "alkenylene chain" refers to a straight or branched divalent hydrocarbon chain linking the rest of the molecule to a radical group, consisting solely of carbon and hydrogen, containing at least one carbon-carbon double bond and having from two to twelve carbon atoms, e.g., ethenylene, propenylene, n-butenylene, and the like. The alkenylene chain is attached to the rest of the molecule through a single bond and to the radical group through a double bond or a single bond. The points of attachment of the alkenylene chain to the rest of the molecule and to the radical group can be through one carbon or any two carbons within the chain. Unless stated otherwise specifically in the specification, alkenylene is optionally substituted.

"Alkynylene" or "alkynylene chain" refers to a straight or branched divalent hydrocarbon chain linking the rest of the molecule to a radical group, consisting solely of carbon and hydrogen, containing at least one carbon-carbon triple bond and having from two to twelve carbon atoms, e.g., ethenylene, propenylene, n-butenylene, and the like. The alkynylene chain is attached to the rest of the molecule through a single bond and to the radical group through a double bond or a single bond. The points of attachment of the alkynylene chain to the rest of the molecule and to the radical group can be through one carbon or any two carbons within the chain. Unless stated otherwise specifically in the specification, alkynylene is optionally substituted.

"Alkoxy" refers to a group of the formula —OR$_a$ where R$_a$ is an alkyl group as defined above containing one to twelve carbon atoms. Unless stated otherwise specifically in the specification, an alkoxy group is optionally substituted.

"Cycloalkyl" refers to a stable non-aromatic monocyclic or polycyclic carbocyclic ring, which may include fused or bridged ring systems, having from three to fifteen carbon atoms, preferably having from three to ten carbon atoms, and which is saturated or unsaturated and attached to the rest of the molecule by a single bond. Monocyclic cyclocalkyls include, for example, cyclopropyl, cyclobutyl, cyclopentyl, cyclohexyl, cycloheptyl, and cyclooctyl. Polycyclic cycloalkyls include, for example, adamantyl, norbornyl, decalinyl, 7,7-dimethyl-bicyclo-[2.2.1]heptanyl, and the like. Unless stated otherwise specifically in the specification, a cycloalkyl group is optionally substituted.

"Aryl" refers to a ring system comprising at least one carbocyclic aromatic ring. In some embodiments, an aryl comprises from 6 to 18 carbon atoms. The aryl ring may be a monocyclic, bicyclic, tricyclic or tetracyclic ring system, which may include fused or bridged ring systems. Aryls include, but are not limited to, aryls derived from aceanthrylene, acenaphthylene, acephenanthrylene, anthracene, azulene, benzene, chrysene, fluoranthene, fluorene, as-indacene, s-indacene, indane, indene, naphthalene, phenalene, phenanthrene, pleiadene, pyrene, and triphenylene. Unless stated otherwise specifically in the specification, an aryl group is optionally substituted.

"Heteroaryl" refers to a 5- to 14-membered ring system comprising one to thirteen carbon atoms, one to six heteroatoms selected from the group consisting of nitrogen, oxygen and sulfur, and at least one aromatic ring. For purposes of certain embodiments of this disclosure, the heteroaryl radical may be a monocyclic, bicyclic, tricyclic or tetracyclic ring system, which may include fused or bridged ring systems; and the nitrogen, carbon or sulfur atoms in the heteroaryl radical may be optionally oxidized; the nitrogen atom may be optionally quaternized. Examples include, but are not limited to, azepinyl, acridinyl, benzimidazolyl, benzthiazolyl, benzindolyl, benzodioxolyl, benzofuranyl, benzooxazolyl, benzothiazolyl, benzothiadiazolyl, benzo[b][1,4]dioxepinyl, 1,4-benzodioxanyl, benzonaphthofuranyl, benzoxazolyl, benzodioxolyl, benzodioxinyl, benzopyranyl, benzopyranonyl, benzofuranyl, benzofuranonyl, benzothienyl (benzothiophenyl), benzotriazolyl, benzo[4,6]imidazo[1,2-a]pyridinyl, benzoxazolinonyl, benzimidazolthionyl, carbazolyl, cinnolinyl, dibenzofuranyl, dibenzothiophenyl, furanyl, furanonyl, isothiazolyl, imidazolyl, indazolyl, indolyl, indazolyl, isoindolyl, indolinyl, isoindolinyl, isoquinolyl, indolizinyl, isoxazolyl, naphthyridinyl, oxadiazolyl, 2-oxoazepinyl, oxazolyl, oxiranyl, 1-oxidopyridinyl, 1-oxidopyrimidinyl, 1-oxidopyrazinyl, 1-oxidopyridazinyl, 1-phenyl-1H-pyrrolyl, phenazinyl, phenothiazinyl, phenoxazinyl, phthalazinyl, pteridinyl, pteridinonyl, purinyl, pyrrolyl, pyrazolyl, pyridinyl, pyridinonyl, pyrazinyl, pyrimidinyl, pryrimidinonyl, pyridazinyl, pyrrolyl, pyrido[2,3-d]pyrimidinonyl, quinazolinyl, quinazolinonyl, quinoxalinyl, quinoxalinonyl, quinolinyl, isoquinolinyl, tetrahydroquinolinyl, thiazolyl, thiadiazolyl, thieno[3,2-d]pyrimidin-4-onyl, thieno[2,3-d]pyrimidin-4-onyl, triazolyl, tetrazolyl, triazinyl, and thiophenyl (i.e., thienyl). Unless stated otherwise specifically in the specification, a heteroaryl group is optionally substituted.

The term "substituted" used herein means any of the above groups (e.g., alkyl, alkylene, alkenylene, alkynylene, heteroalkylene, heteroalkenylene, heteroalkynylene, alkoxy, alkylether, alkoxyalkylether, heteroalkyl, heteroalkoxy, phosphoalkyl, phosphoalkylether, thiophosphoalkyl, thiophosphoalkylether, carbocyclic, cycloalkyl, aryl, heterocyclic and/or heteroaryl) wherein at least one hydrogen atom (e.g., 1, 2, 3 or all hydrogen atoms) is replaced by a bond to a non-hydrogen atoms such as, but not limited to: a halogen atom such as F, Cl, Br, and I; an oxygen atom in groups such as hydroxyl groups, alkoxy groups, and ester groups; a sulfur atom in groups such as thiol groups, thioalkyl groups, sulfone groups, sulfonyl groups, and sulfoxide groups; a nitrogen atom in groups such as amines, amides, alkylamines, dialkylamines, arylamines, alkylarylamines, diarylamines, N-oxides, imides, and enamines; a silicon atom in groups such as trialkylsilyl groups, dialkylarylsilyl groups, alkyldiarylsilyl groups, and triarylsilyl groups; and other heteroatoms in various other groups. "Substituted" also means any of the above groups in which one or more hydrogen atoms are replaced by a higher-order bond (e.g., a double- or triple-bond) to a heteroatom such as oxygen in oxo, carbonyl, carboxyl, and ester groups; and nitrogen in groups such as imines, oximes, hydrazones, and nitriles. For example, "substituted" includes any of the above groups in which one or more hydrogen atoms are replaced with —NR$_g$R$_h$, —NR$_g$C(=O)R$_h$, —NR$_g$C(=O)NR$_g$R$_h$, —NR$_g$C(=O)OR$_h$, —NR$_g$SO$_2$R$_h$, —OC(=O)NR$_g$R$_h$, —OR$_g$, —SR$_g$, —SOR$_g$, —SO$_2$R$_g$, —OSO$_2$R$_g$, —SO$_2$OR$_g$, =NSO$_2$R$_g$, and —SO$_2$NR$_g$R$_h$. "Substituted" also means any of the above groups in which one or more hydrogen atoms are replaced with —C(=O)R$_g$, —C(=O)OR$_g$, —C(=O)NR$_g$R$_h$, —CH$_2$SO$_2$R$_g$, and —CH$_2$SO$_2$NR$_g$R$_h$. In the foregoing, R$_g$ and R$_h$ are the same or different and independently hydrogen, alkyl, alkoxy, alkylamino, thioalkyl, aryl, aralkyl, cycloalkyl, cycloalkylalkyl, haloalkyl, heterocyclyl, N-heterocyclyl, heterocyclylalkyl, heteroaryl, N-heteroaryl and/or heteroarylalkyl. "Substituted" further means any of the above groups in which one or more hydrogen atoms are replaced by a bond to an amino, cyano, hydroxyl, imino, nitro, oxo, thioxo, halo, alkyl, alkoxy, alkylamino, thioalkyl, aryl, aralkyl, cycloalkyl, cycloalkylalkyl, haloalkyl, heterocyclyl, N-heterocyclyl, heterocyclylalkyl, heteroaryl, N-heteroaryl and/or heteroarylalkyl group. In addition, each of the foregoing substituents may also be optionally substituted with one or more of the above substituents.

To continue to reduce device sizes produced from lithography, photolithographic systems have been developed to use extreme ultraviolet (EUV) light which has very short wavelengths (13.5 nm or shorter) that can allow very small image formation. However, conventional systems and methods of performing EUV lithography may have shortcomings. For example, conventional photoresist materials are typically organic materials. These organic photoresist materials normally have low photon absorption in the EUV range, which makes achieving high resolution with EUV light difficult. Organometallic oxide hydroxide clusters have been shown to be useful as suitable EUV photoresist materials for achieving fine patterning. The high EUV absorption cross section and small building block size of the organometallic oxide hydroxide clusters allow high sensitivity and resolution as well as low line-edge roughness.

However, a variety of issues may occur especially at the interface of organometallic oxide hydroxide clusters and an underlying layer, e.g., a bottom anti-reflective coating (BARC) layer. For example, organometallic oxide hydroxide clusters are obtained by hydrolysis of precursor organometallic compounds containing hydrolysable ligands using water in the ambient atmosphere followed by condensation of hydrolyzed organometallic compounds. Oftentimes, water in the ambient atmosphere does not result in the complete hydrolysis of the precursor organometallic compounds at the interface. The partially hydrolyzed organometallic compounds may couple the organometallic oxide hydroxide clusters to the underlying BARC layer, thereby forming aggregates of the organometallic oxide hydroxide clusters. It has been observed that deposition of organometallic photoresists onto highly polar surfaces, for example surfaces rich in —OH, can lead to formation of aggregates of organometallic oxide hydroxide clusters. Such aggregates can cause higher levels of scum/broken defects.

Compositions and methods to facilitate complete hydrolysis of organometallic photoresist precursor compounds are provided. In embodiments of the present application, a hydrolysis promoting agent is introduced into a BARC layer underlying the photoresist layer. The hydrolysis promoting agent can either absorb water from ambient atmosphere or react with an acid or base in the BARC layer to produce water, thereby promoting conversion of partially hydrolyzed organometallic compound to organometallic oxide hydroxide clusters, which avoid scum formation. This can, in turn, lead to lower defect rates in lithographic patterning and corresponding reductions in integrated circuit manufacturing costs.

FIG. 1 is a flowchart of a method 100 of forming a semiconductor device, in accordance with some embodiments of the present disclosure. FIGS. 2A-2E are cross-sectional views of a semiconductor device 200 fabricated according to one or more steps of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

The semiconductor device 200 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The semiconductor device 200 includes a plurality of semiconductor devices (e.g., transistors), which may be interconnected.

Figure 2A:
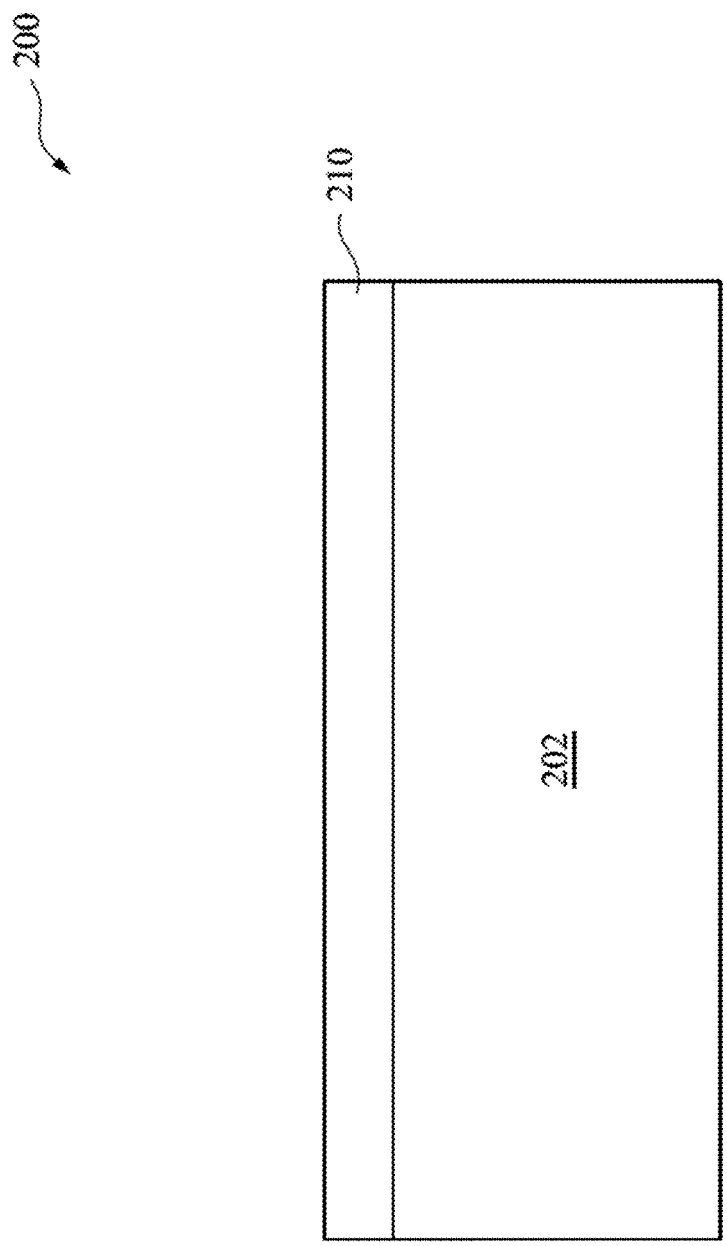
FIGS. 2A-2H are cross-sectional views of a semiconductor structure fabricated using the method of FIG. 1, in accordance with some embodiments.

Referring to FIGS. 1 and 2A, the method 100 include an operation 102, in which a bottom material layer 210 is deposited over a substrate 202, in accordance with some embodiments. FIG. 2A is a cross-sectional view of a semiconductor device 200 after depositing the bottom material layer 210 over the substrate 202. The bottom material layer 210 may be a first layer of a trilayer patterning stack.

In some embodiments, the substrate 202 is a bulk semiconductor substrate including one or more semiconductor materials. In some embodiments, the substrate 202 includes silicon, silicon germanium, carbon doped silicon (Si:C), silicon germanium carbide, or other suitable semiconductor materials. In some embodiments, the substrate 202 is composed entirely of silicon.

In some embodiments, the substrate 202 includes one or more epitaxial layers formed on a top surface of a bulk semiconductor substrate. In some embodiments, the one or more epitaxial layers introduce strains in the substrate 202 for performance enhancement. For example, the epitaxial layer includes a semiconductor material different from that of the bulk semiconductor substrate, such as a layer of silicon germanium overlying bulk silicon or a layer of silicon overlying bulk silicon geranium. In some embodiments, the epitaxial layer(s) incorporated in the substrate 202 are formed by selective epitaxial growth, such as, for example, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), or combinations thereof.

In some embodiments, the substrate 202 is an active layer of a semiconductor-on-insulator (SOI) substrate. In some embodiments, the SOI substrate includes a semiconductor layer, such as a silicon layer formed on an insulator layer. In some embodiments, the insulator layer is a buried oxide (BOX) layer including silicon oxide or silicon germanium oxide. The insulator layer is provided on a handle substrate such as, for example, a silicon substrate. In some embodiments, the SOI substrate is formed using separation by implanted oxygen (SIMOX) or wafer bonding.

The substrate 202 may also include other material layers and other circuit patterns. In some embodiments, the substrate 202 includes various doped regions formed by a process such as ion implantation and/or diffusion. The doped regions are doped with p-type and/or n-type dopants. The term "p-type" refers to the addition of impurities to an intrinsic semiconductor that creates deficiencies of valence electrons. Examples of p-type dopants, i.e., impurities, include, but are not limited to, boron, boron difluoride, gallium, and indium. The term "n-type" refers to the addition of impurities that contributes free electrons to an intrinsic semiconductor. Examples of n-type dopants, i.e., impurities, include, but are not limited to, antimony, arsenic, and phosphorous. In other embodiments, the substrate 202 may further include one or more material layers to be patterned (by etching to remove or ion implantation to introduce dopants), such as a dielectric layer to be patterned to form trenches for conductive lines or holes for contacts or vias; a gate material stack to be patterned to form gates; or a semiconductor material to be patterned to form isolation trenches. For example, a material layer to be patterned is a semiconductor layer as a part of the substrate 202. In other embodiments, multiple semiconductor material layers, such as gallium arsenic (GaAs) and aluminum gallium arsenic (AlGaAs), are epitaxially grown on the substrate 202 and are patterned to form various devices, such as light-emitting diodes (LEDs). In some other embodiments, the substrate 202 includes fin active regions and three dimensional fin field-effect transistors (FinFETs) formed or to be formed thereon.

The bottom material layer 210 is deposited on the substrate 202. The bottom material layer 210 functions as a mask to protect the substrate 202 from etching or ion implantation. In some embodiments, the bottom material layer 210 also functions as a planarization layer to provide a planar surface upon which a middle material layer 220 (FIG. 2B) is formed. In some embodiments, the bottom material layer 210 includes an organic polymer free of silicon. For example, the bottom material layer 210 may include spin-on carbon, diamond-like carbon, polyarylene ether, or polyimide. In some embodiments, the bottom material layer 210 is formed by spin coating, spry coating, dip coating, or other suitable deposition processes. The bottom material layer 210 is formed to have a thickness sufficient to provide a planar surface and etching resistance. In some embodiments, the bottom material layer 210 may have a thickness ranging from about 50 nm to about 300 nm. If the thickness of the bottom material layer 210 is too small, the bottom material layer 210 is not able to provide a planar surface and sufficient etching resistance, in some instances. On the other hand, if the thickness of the bottom material layer 210 is too great, production costs are increased as a result of unnecessary consumption of material and increased processing time to pattern the bottom material layer 210, in some instances.

Figure 2B:
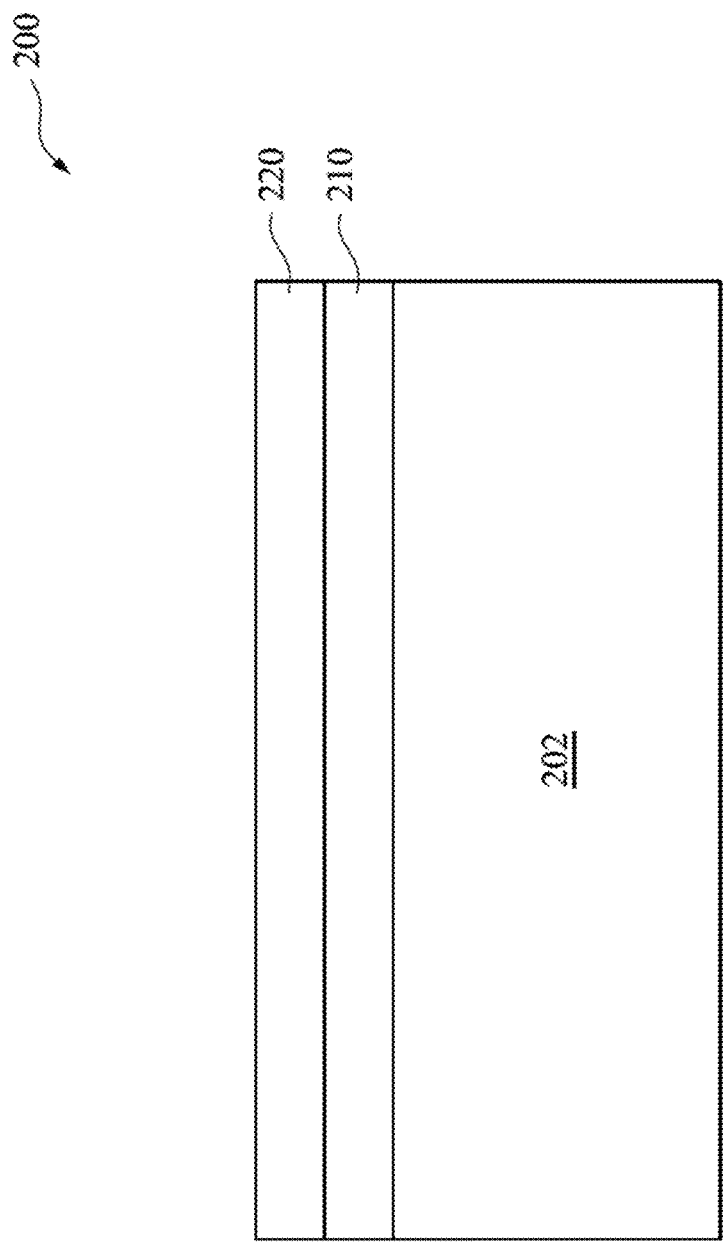

Referring to FIGS. 1 and 2B, the method 100 proceeds to operation 104, in which a middle material layer 220 is deposited over the bottom material layer 210, in accordance with some embodiments. FIG. 2B is a cross-sectional view of the semiconductor device 200 of FIG. 2A after depositing the middle material layer 220 over the bottom material layer 210. The middle material layer 220 may be a second layer of the trilayer patterning stack.

The middle material layer 220 includes a material that provides etching selectivity from the bottom material layer 210. The middle material layer 220 thus functions as an etch mask to transfer a pattern to the bottom material layer 210. In some embodiments, the middle material layer 220 also functions as a bottom anti-reflective coating (BARC) layer that reduces reflection during a lithography exposure process subsequently performed, thereby increasing the imaging contrast and enhancing the imaging resolution. In embodiments of the present disclosure, the middle material layer 220 includes a hydrolysis promoting agent 320 to facilitate the complete hydrolysis and condensation of pre-hydrolyzed organometallic photoresist materials subsequently formed thereon.

Figure 3:
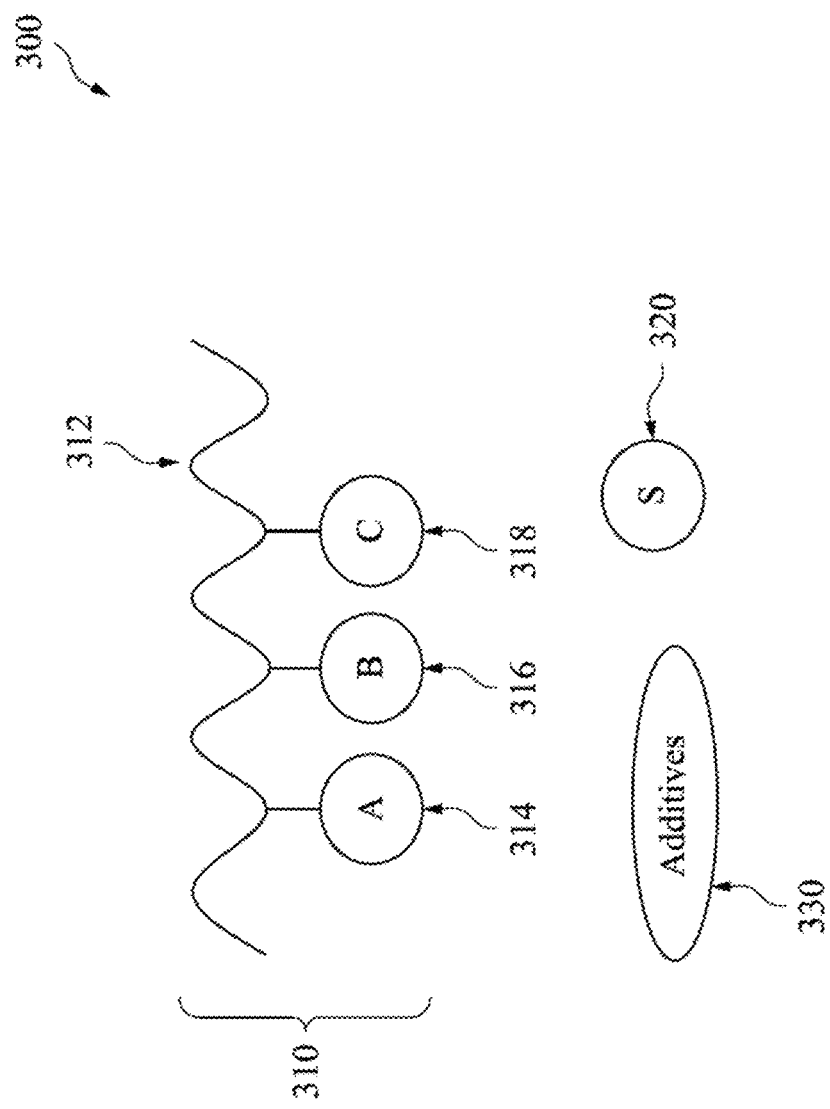
FIG. 3 illustrates a first exemplary composition of a middle material layer in a patterning stack, in accordance with some embodiments.

FIG. 3 illustrates a first exemplary composition 300 of the middle material layer 220, in accordance with some embodiments. As shown in FIG. 3, the middle material layer 220 may include a polymer 310, a hydrolysis promoting agent 320, and one or more additives 330.

The polymer 310 may be an organic polymer or inorganic polymer. In some embodiments, the polymer 310 has a molecular weight from about 1,000 to about 20,000. In some embodiments, the polymer 310 is a copolymer consisting of two or more different monomers. Each monomer introduces or tunes a specific property of the polymer 310. In some embodiments, the polymer 310 is polystyrene (PS), poly (hydroxystyrene) (PHS), poly(methyl methacrylate) (PMMA), a polyether, a polyimide, a polyurethane, a siloxane polymer, or a copolymer thereof, each of which can include different pendant groups attached to the polymer backbone 312. In some embodiments, the pendant groups include first pendant groups 314 (labeled as "A") that provide crosslinking sites, second pendant groups 316 (labeled as "B") containing chromophores that modify the characteristics (such as refractive index n, extinction coefficient κ, and/or etch resistance) of the middle material layer 220, and third pendant groups 318 (labeled as "C") that enhance the adhesion of a photoresist layer subsequently formed and tune other effects, such as etching performance and wet strippability.

In some embodiments, the first pendant group (A) 314 is a cross-linker which functions to cross-link various components in the middle material layer 220 into a polymer network. In some embodiments, the cross-linker is an alkyl group having 2-20 carbons (C2-C20) with at least one crosslinkable functional group, such as —I, —Br, —Cl, —NH$_2$, —COH, —OH, —SH, —N$_3$, epoxy, alkyne, alkene, ketone, aldehyde, ester, acyl halide, NHS ester, imidoester, pentafluorophenyl ester, hydroxymethyl phosphine, carbodiimide, maleimide, haloacetyl, pyridyldisulfide, thiosulfonate, vinylsulfone, hydrazide, alkoxyamine, diazirine, aryl azide, isocyanate, phosphine, amide, ether, or a combination thereof.

In some embodiments, the second pendant group (B) 316 includes an alkyl group having 3-20 carbons (C3-C20) with at least one light-sensitive functional group, such as aromatic groups or heteroaryl groups, capable of absorbing the impinging light and preventing the light from being reflected. Exemplary aromatic groups include, but are not limited to, phenyl, napthlenyl, phenanthrenyl, anthracenyl, phenalenyl, pyrene, perylene, and other aromatic derivatives containing three or more rings. Exemplary heteroaryl groups include, but are not limited to, acridine, pyrrolidinyl, pyranyl, piperidinyl, and quinolinyl.

In some embodiments, the third pendant group (C) 318 includes an alkyl group having 1-20 carbons (C1-C20) with a non-cyclic structure or a cyclic structure. For example, the cyclic structure is an aromatic ring. The third pendant group 318 is adapted to enhance photoresist adhesion, etching resistance, and wet strippability. In other examples, the alkyl group further includes a functionalized group, such as —I, —Br, —Cl, —NH$_2$, —COH, —OH, —SH, —N$_3$, S(=O), alkene, alkyne, imine, ether, ester, aldehyde, ketone, amide, sulfone, acetic acid, cyanide, or a combination thereof.

In some embodiments, the middle material layer 220 includes a hydrolysis promoting agent (S) 320 for facilitating complete hydrolysis and condensation of an organometallic photoresist subsequently formed thereon during the organometallic photoresist soft baking process. In some embodiments, the hydrolysis promoting agent (S) 320 is adapted to absorb water from the ambient environment to facilitate complete hydrolysis and condensation of the organometallic photoresist. In some embodiments, the hydrolysis promoting agent (S) 320 can be a high boiling point solvent or a diffusible molecule containing one or more polar functional groups. In some embodiments, the high boiling point solvent includes dimethyl sulfoxide (DMSO), dimethylacetamide (DMAC), dimethyl formamide (DMF), ortho, meta or para-toluidine, p-toluene sulfonic acid, pyridine, chlorobenzene, tetrachloroethane, cumene, propionic acid, 1-hexanol, m-butanol, or acetic acid. In some embodiments, the diffusible molecule has the formula (I):

$$R_1—X \qquad (I)$$

In the formula (I), $R_1$ is an alkyl, cycloalkyl or aryl group and X is a polar functional group. Exemplary groups for $R_1$ include methyl, ethyl, propyl, butyl, pentyl, hexyl, benzyl, phenethyl, naphthyl; phenoxy, methylphenoxy, dimethylphenoxy, ethylphenoxy, and phenyloxy-methyl. Exemplary groups for X include —I, —Br, —Cl, —NH$_2$, —COOH, —OH, —SH, —N$_3$, —S(=O)—, imine, ether, ester, aldehyde, ketone, amide, sulfone, acetic acid, cyanide, phosphine, phosphite, aniline, pyridine, and pyrrole.

In some embodiments, the high boiling point solvent or the diffusible molecule has a boiling point greater than 180° C. such that after baking of the middle material layer 220, the polar solvent or diffusible molecule can remain in the middle material layer 220 to assist the hydrolysis of organometallic photoresist materials during the organometallic photoresist soft-baking process.

In some embodiments, the middle material layer 220 may further include one or more additives 330 adapted to modify the characteristics and enhance the performance (such as wettability and accordingly enhancing the cleaning mechanism during the cleaning process) of the middle material layer 220. For example, in some embodiments, the middle material layer 220 may include a surfactant for improving the ability of the middle material layer 220 to coat the surface on which it is applied (e.g., the top surface of the bottom material layer 210). In some embodiments, the surfactant may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include, but are not limited to, polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, combinations of these, and the like.

Another additive that may be added to the middle material layer 220 is a quencher, which may be utilized to inhibit diffusion of the generated acids/bases/free radicals within the middle material layer 220, and thereby helps to improve the stability of the middle material layer 220 over time. In some embodiments, the quencher is an amine such as a second lower aliphatic amine, a tertiary lower aliphatic amine, or the like. Specific examples of amines that may be used include, but are not limited to, trimethylamine, diethylamine, triethylamine, di-n-propylamine, tri-n-propylamine, tripentylamine, diethanolamine, triethanolamine, alkanolamine, combinations of these, and the like.

Alternatively, an organic acid may be utilized as the quencher. Specific examples of organic acids that may be utilized include, but are not limited to, malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Figure 4:
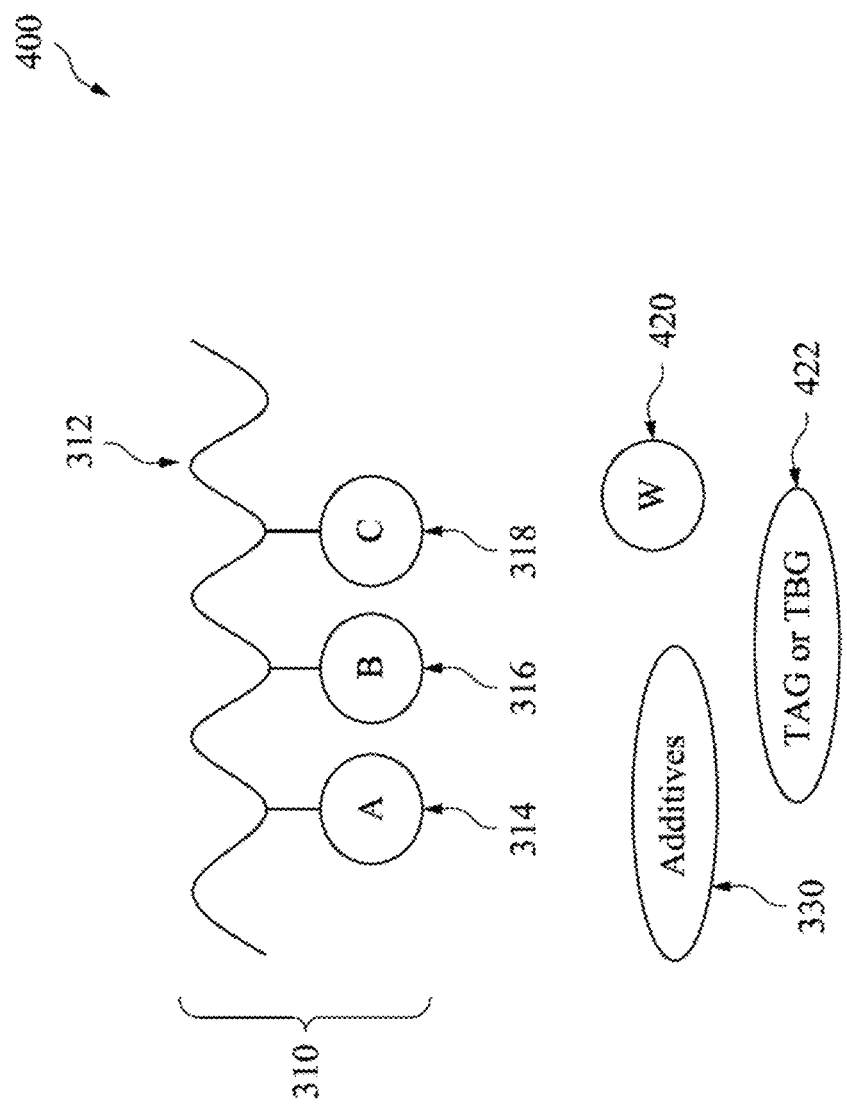
FIG. 4 illustrates a second exemplary composition of a middle material layer in a patterning stack, in accordance with some embodiments.

FIG. 4 illustrates a second exemplary composition 400 of the middle material layer 220, in accordance with some embodiments. As shown in FIG. 4, the middle material layer 220 may include a polymer 310 as described above in FIG. 3, a hydrolysis promoting agent (W) 420, an acid or base generator 422, and one or more additives 330 as described above in FIG. 3.

Unlike the hydrolysis promoting agent (S) 320 in the first exemplary composition 300, which is a high boiling point solvent or a diffusible molecule adapted to absorb water from ambient environment, the hydrolysis promoting agent (W) 420 in the second exemplary composition 400 is a water releasable compound that can release water in acid or basic conditions to facilitate the complete hydrolysis and condensation of the organometallic photoresist materials. In some embodiments, the hydrolysis promoting agent (W) 420 is an organic compound containing one or more OH groups. In some embodiments, the hydrolysis promoting agent (W) 420 includes an alcohol such as ethanol, 1-butanol, 1-propanol, 2-propanol, 2-butanol, isobutyl alcohol, 1-pentanol, 2-pentanol, or 2-methyl-2-pentanol. In some other embodiments, the hydrolysis promoting agent (W) 420 includes a diol containing an alkyl group of at least two carbon atoms and two OH groups such as propylene glycol, ethylene glycol, or 1,3-propanediol. In still some embodiments, the hydrolysis promoting agent (W) 420 includes a polyol containing an alkyl group of at least two carbon atoms and more than two OH groups such as glycerin, trimethylolpropane, or pentaerythritol. The alcohol, diol or polyol may further include a functional group such as —I, —Br, —Cl, —NH$_2$, —COOH, —OH, —SH, —N$_3$, —S(=O)—, imine, ether, ester, aldehyde, ketone, amide, sulfone, acetic acid, cyanide, phosphine, phosphite, aniline, pyridine, or pyrrole.

The acid or base generator 422 functions as a cross-linking accelerator, which promotes the cross-linking reaction and increases the reaction efficiency of the polymer 310. In some embodiments, the acid generator is a thermal acid generator (TAG) capable of releasing an acid upon thermal treatment. Exemplary thermal acid generators that are suitably employed include, but are not limited to, 2,4,4,6-tetrabromocyclohexadienone, 2-hydroxyhexyl p-toluenesulfonate, 2-nitrophenyl tosylate and other alkyl esters of organic sulfonic acids. In some embodiments, the base generator is a thermal base generator (TBG) capable of releasing a base upon thermal treatment. The thermal base generator may comprise a compound belonging to a group such as amides, sulfonamides, imides, imines, O-acyl oximes, benzoyloxycarbonyl derivatives, quaternary ammonium salts, and nifedipines, examples of which may include o-{(β (dimethylamino) ethyl)aminocarbonyl benzoic acid, o-{(γ (dimethylamino)propyl) aminocarbonyl}benzoic acid, 2,5-bis{(β-(dimethylamino) ethyl)aminocarbonyl}terephthalic acid, 2,5-bis{(γ-(dimethylamino)propyl)aminocarbonyl} terephthalic acid, 2,4-bis{(β-(dimethylamino)ethyl)aminocarbonyl}isophthalic acid, and 2,4-bis{(γ-(dimethylamino)propyl) aminocarbonyl} isophthalic acid.

To form the middle material layer 220, various components of the middle material layer 220 are placed into a solvent in order to aid in the mixing and application of the middle material layer 220. In some embodiments, the solvent may be an organic solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Exemplary solvents that can be used for formation of middle material layer 220 include, but are not limited to, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, butylene carbonate, acetate-2-methoxyethyl, acetate-2-ethoxyethyl, acetate-2-(2-ethoxyethoxyl)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol monoacetate, dioxane, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether, methyl proponiate, ethyl proponiate, ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and phenyl cellosolve acetate.

Once the solution containing various components of the middle material layer 220 has been prepared, the solution is applied onto the bottom material layer 210, if present, or onto the substrate 202 by, for example, spin coating.

Figure 2C:
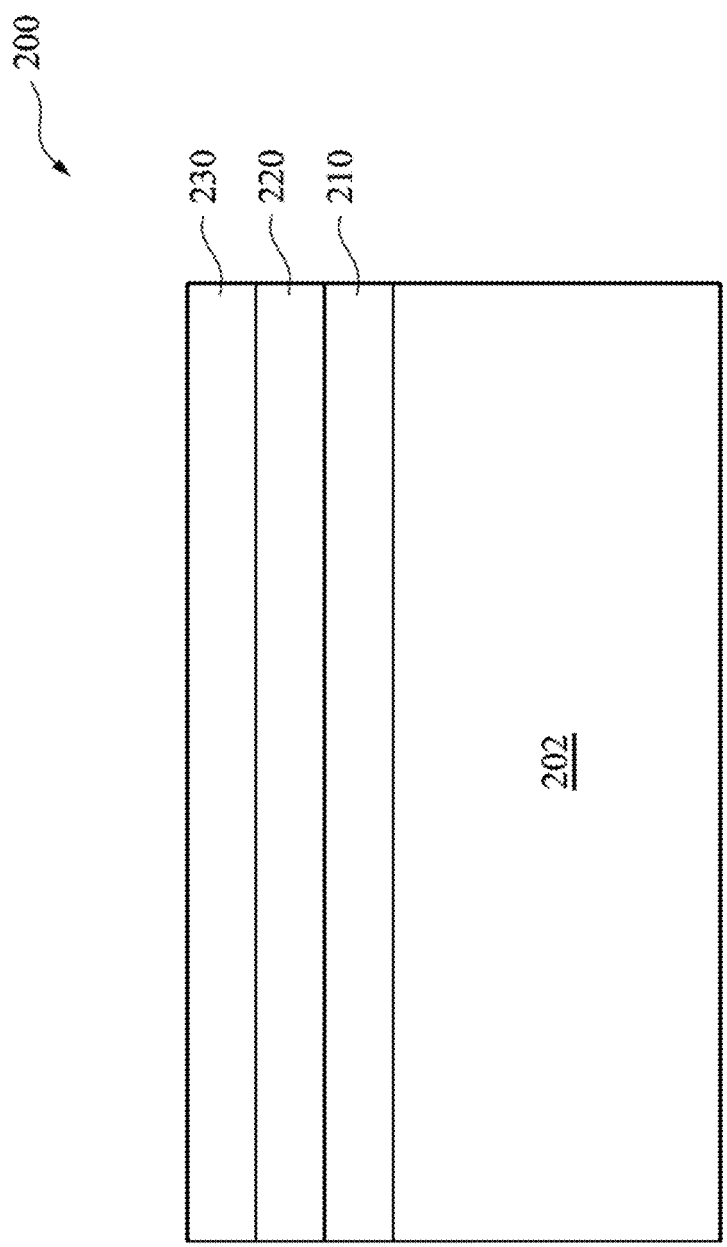
Figure 2D:
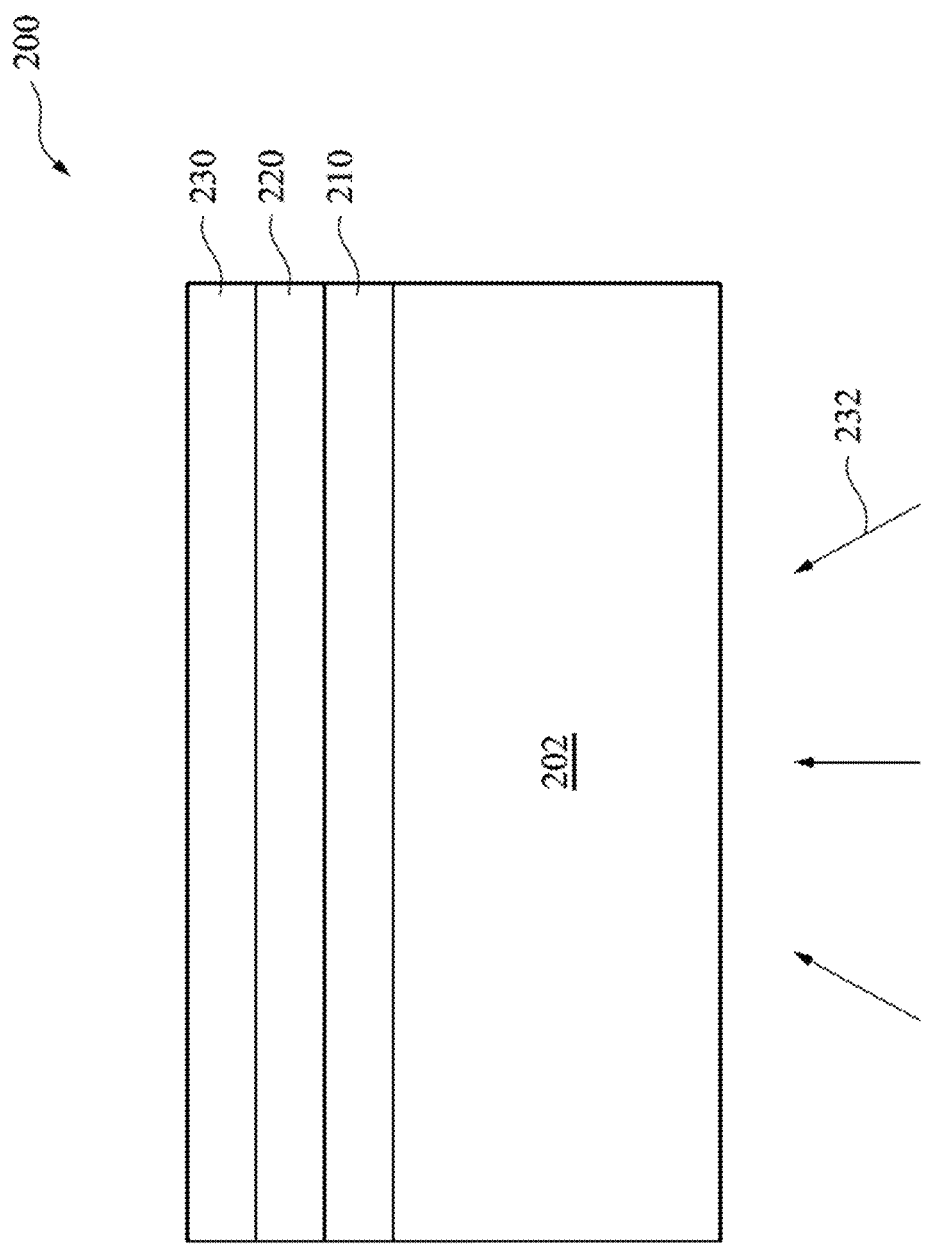

Subsequently, a pre-baking process is performed to cure and dry the middle material layer 220 prior to application of a photoresist layer 230 (FIG. 2D). The curing/drying of the middle material layer 220 removes the solvent from the middle material layer 220 but the hydrolysis promoting agent 320 remains. In some embodiments, the pre-baking process may be performed at a temperature and for a time period suitable to evaporate the solvent but not the hydrolysis promoting agent 320. For example, in some embodiments, the pre-baking process is performed at a temperature between about 40° C. and 180° C. for about 10 seconds to about 5 minutes. Additionally, the pre-baking process will cause the cross-linking of the polymer 310 to provide a good solvent resistance to the middle material layer 220, so as to allow application of the photoresist layer 230 without dissolving the middle material layer 220.

Referring to FIGS. 1 and 2C, the method 100 proceeds to operation 106, in which a photoresist layer 230 is deposited over the middle material layer 220, in accordance with some embodiments. FIG. 2C is a cross-sectional view of the semiconductor device 200 of FIG. 2B after depositing the photoresist layer over the middle material layer. The photoresist layer 230 may be a top material layer of the trilayer patterning stack.

In some embodiments, the photoresist layer 230 is a photosensitive layer operable to be patterned by an EUV radiation. In some embodiments, the photoresist layer 230, as deposited, comprises a partially hydrolyzed organometallic compound obtained from in situ hydrolysis of a precursor organometallic compound having the formula (II):

In the formula (II), M is a metal with a high EUV radiation-absorption cross-section. Exemplary metals having a high EUV radiation-absorption cross-section include, but are not limited to, tin (Sn), antimony (Sb), and indium (In). R is a cleavable organic ligand that can be cleaved under the EUV radiation to form metal oxo clusters. In some embodiments, R, at each occurrence, is independently an alkyl group having 1 to 12 carbon atoms or an aryl group having 5 to 30 carbon atoms. Exemplary groups for R include, but are not limited to, methyl, ethyl, propyl, butyl, pentyl, hexyl, benzyl, phenethyl, and naphthyl. L, at each occurrence, is independently a hydrolysable ligand that can be replaced with a hydroxy group through a reaction with water. Exemplary hydrolysable ligands include, but are not limited to, an alkoxy group, an aryloxy group, a halogen atom, an acetoxy group, an acyloxy group, an isocyanate group, and the like. In some embodiments, the hydrolyzable group is an alkoxy group such as a methoxy group, an ethoxy group, a propoxy group, or a butoxy group. n is an integer of 1 or 2.

In some embodiments, the in situ hydrolysis of the precursor organometallic compound of formula (II) forms an organometallic dimer M2 having the structure of $(R_nM)_2(OH)_2L_{4-n}(H_2O)_2$. In some embodiments, where M is tin, such precursor organometallic compound includes t-butyl tris(dimethylamino) tin, i-butyl tris(dimethylamino) tin, n-butyl tris(dimethylamino) tin, sec-butyl tris(dimethylamino) tin, ipropyl(tris)dimethylamino tin, n-propyl tris (diethylamino) tin, and analogous alkyl(tris)(t-butoxy) tin compounds such as t-butyl tris(t-butoxy) tin, i-butyl tris (tbutoxy) tin, n-butyl tris(t-butoxy) tin, sec-butyl tris(t-butoxy) tin, i-propyl(tris) butoxy tin, n-propyl tris(t-butoxy) tin, as well as halogen substituted forms of these materials. In some examples, the organometallic compound may include t-butyltrichlorotin, i-butyltrichlorotin, n-butyltrichlorotin, sec-butyltrichlorotin, ipropyltrichlorotin, n-propyltrichlorotin, t-butyltribromotin, i-butyltribromotin, nbutyl-tribomotin, sec-butyltribomotin, i-propyltribromotin, n-propyltribromotin, etc. In embodiments, the precursor organometallic compound is n-butyltrichlorotin ($C_4H_9SnCl_3$), and the resulting organometallic dimer is the organotin dimer Sn2 having the structure of $(C_4H_9Sn)_2(OH)_2Cl_4(H_2O)_2$.

In some embodiments, the photoresist layer 230 further includes a surfactant, a quencher, or a photoacid generator (PAG) that produces an acid upon radiation. Examples of suitable surfactants and quenches are provided above with respect to middle material layer 220. PAGs currently used in photoresists are ionic PAGs. Ionic PAGs are typically salts comprising a photoactive cation and an anion. Exemplary PAG anions include antimony fluoride ($SbF_6^-$), and phosphorus fluoride ($PF_6^-$). These materials respectively react to form hydrogen hexafluoroantimonate ($HSbF_6$) and fluorophosphoric acid ($HPF_6$), respectively, upon UV exposure. Exemplary PAG cations include triarylsulfonium and diaryliodonium.

In some embodiments, the photoresist layer 230 is formed by first dissolving the precursor organometallic compound of formula (II) in a suitable organic solvent to provide a precursor solution. Exemplary solvents that can be used to prepare the precursor solution include, but are not limited to, aromatic compounds (e.g., xylenes, toluene), ethers (anisole, tetrahydrofuran), esters (propylene glycol monomethyl ether acetate, ethyl acetate, ethyl lactate), alcohols (e.g., 4-methyl-2-propanol, 1-butanol, methanol, isopropyl alcohol, 1-propanol), ketones (e.g., methyl ethyl ketone), mixtures thereof, and the like. In the precursor solution, the precursor organometallic compound $R_n$-M-$L_{4-n}$ undergoes in situ -M-L hydrolysis in the presence of water to form the partially hydrolyzed organometallic dimer M2. Subsequently, the precursor solution is applied onto the middle material layer 220 to produce the photoresist layer 230 comprised of the organometallic dimer M2.

Referring to FIGS. 1 and 2D, the method 100 proceeds to operation 108, in which a baking process 232 is performed to the semiconductor device 200, in accordance with some embodiments. FIG. 2D is a cross-sectional view of the semiconductor device 200 after performing the baking process 232. Since this baking process 232 is performed before exposing the photoresist layer 230 to an EUV radiation, the baking process 232 is also referred to as a pre-exposure-baking process. The pre-exposure-baking process 232 removes the solvent from the photoresist layer 230. In some embodiments, the pre-exposure-baking process 232 is conducted at a temperature ranging from 50° C. to about 150° C. for a duration from about 30 seconds to about 300 seconds.

During the pre-exposure-baking process 232, the organometallic dimer M2 undergoes further hydrolysis in the presence of water. The resulting M-OH or M-$OH_2$ ligands after hydrolysis may then react with each other via subsequent condensation to form an organometallic oxide hydroxide cluster with desired photoresist properties. In some embodiments, the organometallic oxide hydroxide cluster is an organometallic dodecamer cluster having the structure of $[(RM)_{12}O_{14}(OH)_6]L_2$. In some embodiments, the organometallic dodecamer cluster is an organotin dodecamer cluster (Sn12) having the structure of $[(BuSn)_{12}O_{14}(OH)_6]L_2$. The organotin dodecamer cluster contains twelve Sn atoms with alkyl ligands as well as bridging hydroxo and oxo ligands. The organometallic oxide hydroxide cluster does not contain active and hydrolysable ligands, and thus is more stable than the organometallic dimer.

In the present disclosure, the hydrolysis promoting agent 320 or 420 in the underlying middle material layer 220 facilitates the complete hydrolysis of the organometallic dimer, which leads to high conversion from the organometallic dimer M2 to the organometallic oxide hydroxide cluster. In this way, the scum caused by aggregation of organometallic oxide hydroxide clusters in the presence of organometallic dimers that would otherwise bridge over proximate resist patterns is prevented. As a result, the photoresist profile is improved, which in turn helps to increase the product yields and reduce the manufacturing cost.

Figure 5:
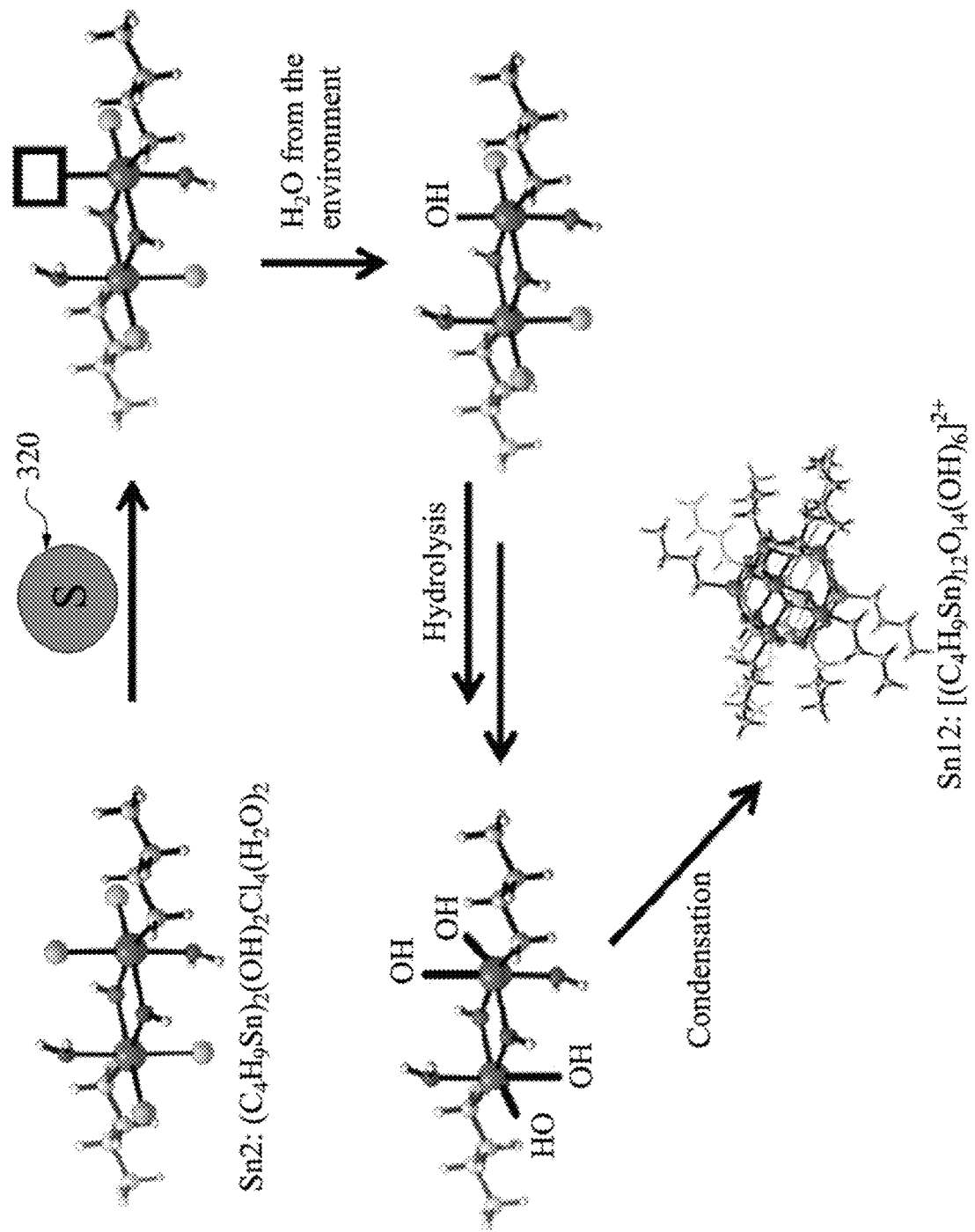
FIG. 5 illustrates hydrolysis and condensation of an organotin dimer induced by a hydrolysis promoting agent in the first exemplary composition of the middle material layer of FIG. 3.

FIG. 5 illustrates hydrolysis and condensation of an organotin dimer Sn2 induced by the hydrolysis promoting agent 320. As shown in FIG. 5, the high boiling point solvent or diffusible compound absorbs water from the ambient atmosphere. Water can diffuse into the photoresist layer 230 to hydrolyze the hydrolysable ligands in the organotin dimer Sn2, forming free hydroxyl groups. The subsequent condensation of the hydroxyl groups affords the organotin dodecamer cluster Sn12.

Figure 6:
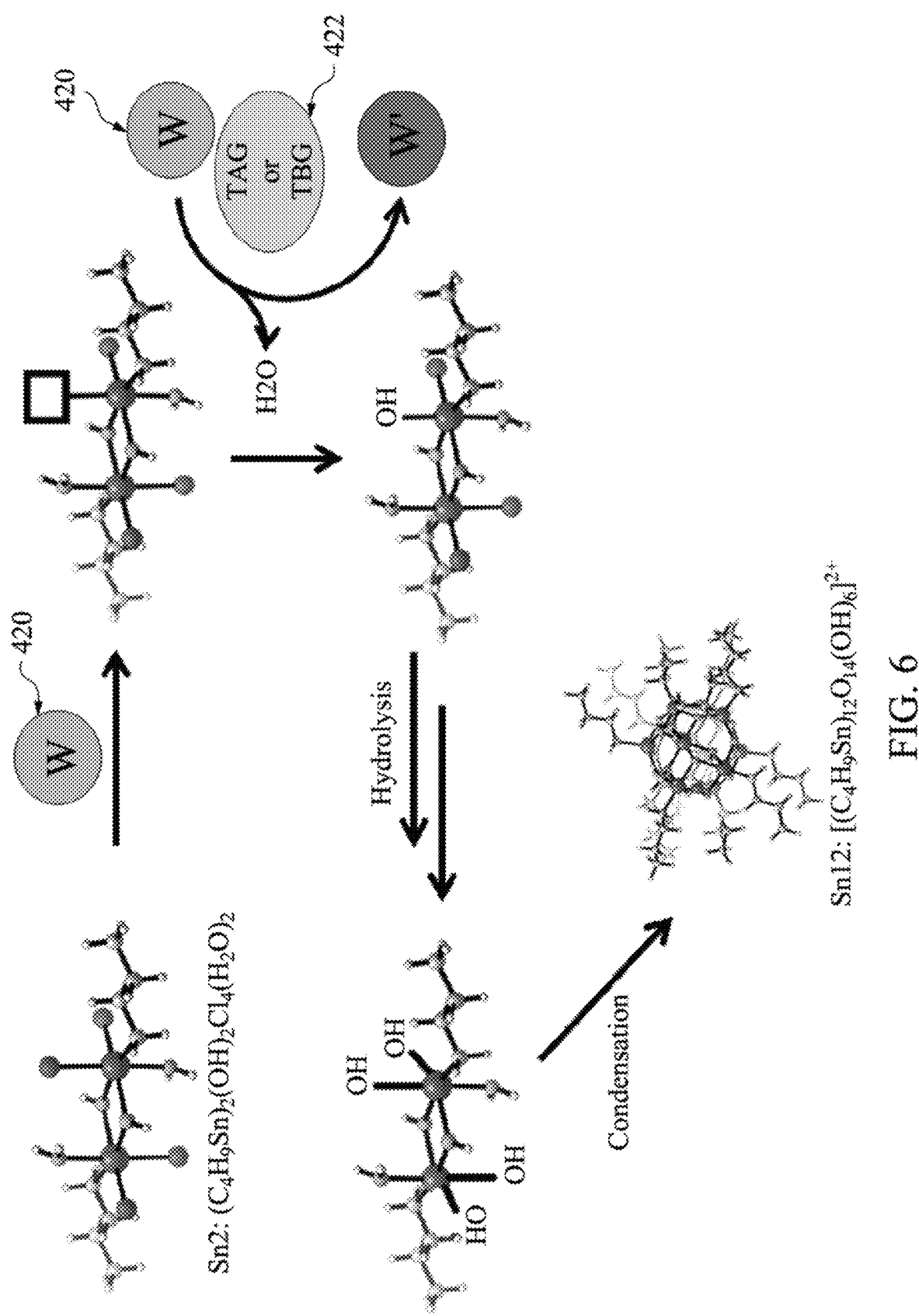
FIG. 6 illustrates hydrolysis and condensation of an organotin dimer induced by a hydrolysis promoting agent in the second exemplary composition of the middle material layer of FIG. 4.

FIG. 6 illustrates hydrolysis and condensation of an organotin dimer Sn2 induced by the hydrolysis promoting agent (W) 420. As shown in FIG. 6, the water releasable compound (W) can react with the residue acid or base generator 422 in the middle material layer 220, and thus releases water. The generated water can diffuse into the photoresist layer 230 to hydrolyze the hydrolyzable ligands in the organotin dimer Sn2, forming free hydroxyl groups. The subsequent condensation of the hydroxyl groups affords the organotin dodecamer cluster Sn12.

Figure 2E:
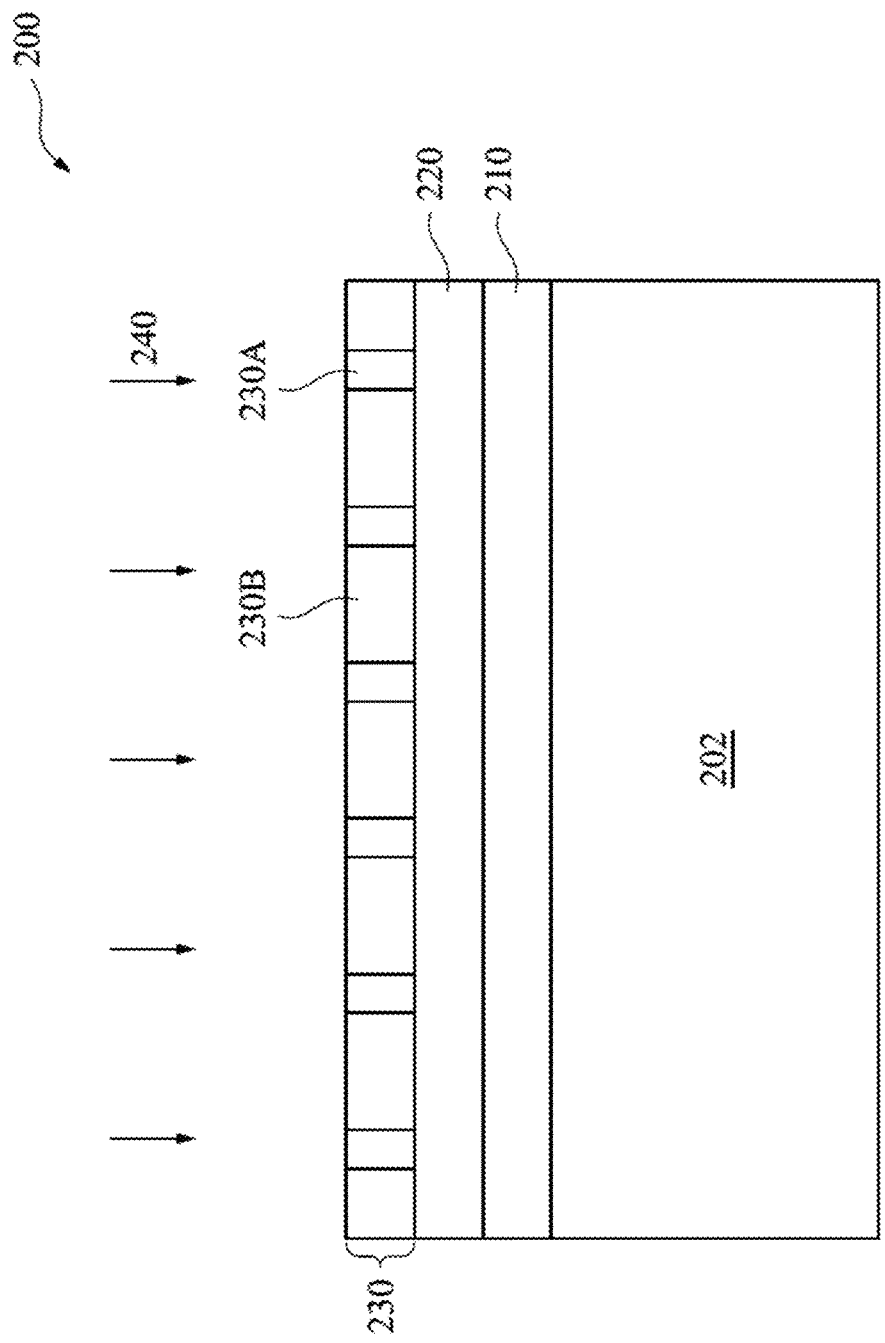

Referring to FIGS. 1 and 2E, the method 100 proceeds to operation 110, in which the photoresist layer 230 is exposed to a patterning radiation 240 to form a pattern in the photoresist layer 230, in accordance with some embodiments. FIG. 2E is a cross-sectional view of the semiconductor device 200 after forming the pattern in the photoresist layer 230.

As shown in FIG. 2E, the photoresist layer 230 includes exposed portions 230A and unexposed portions 230B. The patterning radiation 240 causes cleavage of M-C bonds and crosslinking of the organometallic oxide hydroxide clusters in the exposed portions 230A of the photoresist layer 230, and results in a stable metal oxide ($MO_x$) with a high level of resistance to a developer subsequently used.

The patterning radiation has a wavelength less than 250 nm. In some embodiments, the patterning radiation 240 is a deep ultraviolet (DUV) radiation such as KrF excimer laser (248 nm) or ArF excimer laser (193 nm), an EUV radiation (13.5 nm), an e-beam radiation, an x-ray radiation, an ion beam radiation, or other suitable radiations. In some embodiments, the photoresist layer 230 is exposed to an EUV radiation beam with exposure energy from about 10 $mJ/cm^2$ to about 60 $mJ/cm^2$. If the exposure energy is too high, the efficiency of patterning does not change but production cost increases, in some instances. If the exposure energy is too low, the efficiency of patterning is too low, in some instances. In some embodiments, operation 110 is performed in a liquid (immersion lithography) or in a vacuum for EUV lithography and e-beam lithography.

Subsequently, the photoresist layer 230 may be subjected to a post-exposure bake process. The post-exposure bake process may be performed at a temperature from about 50° C. to about 200° C. for a duration from about 60 seconds to about 360 seconds.

Figure 2F:
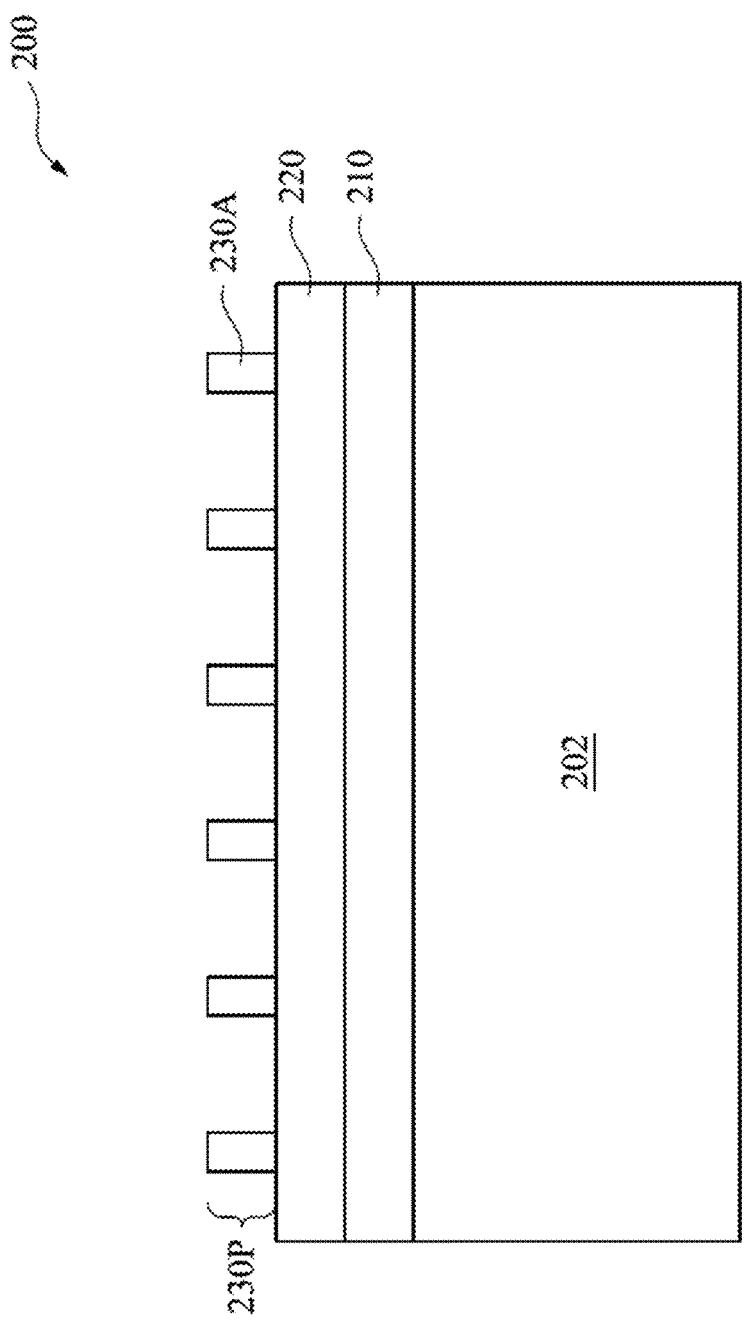

Referring to FIGS. 1 and 2F, the method 100 proceeds to operation 112, in which the photoresist layer 230 is developed using a developer to form a patterned photoresist layer 230P, in accordance with some embodiments. FIG. 2F is a cross-sectional view of the semiconductor device of FIG. 2E after forming the patterned photoresist layer 230P.

During the developing process, the developer is applied to the photoresist layer 230. The developer may remove the exposed or unexposed portions 230A, 230B depending on the resist type. For example and as shown in FIG. 2F, the photoresist layer 230 comprises a negative-type resist, so the exposed portions 230A are not dissolved by the developer and remain over the middle material layer 220 after the developing process. If the photoresist layer 230 comprises a positive-type resist, the exposed portions 230A would be dissolved by the developer, leaving the unexposed portions 230B over the middle material layer 220 after the developing process.

The remaining exposed portions 230A (or unexposed portions 230B) define a pattern in the patterned photoresist layer 230P. The pattern contains one or more openings that expose portions of the underlying middle material layer 220. Because of the small size of the organometallic oxide hydroxide clusters, the pattern in the patterned photoresist layer 230P is able to define features with pitches from about 24 nm to about 36 nm.

The developer may include alcohols, aromatic hydrocarbons, and the like. Examples of alcohols include, but are not limited to, methanol, ethanol, 1-butanol, and 4-Methyl-2-pentanol. Examples of aromatic hydrocarbons include, but are not limited to, xylene, toluene and benzene. In some embodiments, the developer is selected from at least one of methanol, 4-Methyl-2-pentanol and xylene.

The developer may be applied using any suitable methods. In some embodiments, the developer is applied by dipping the structure of FIG. 2E into a developer bath. In some embodiments, the developing solution is sprayed into the photoresist layer 230.

Figure 2G:
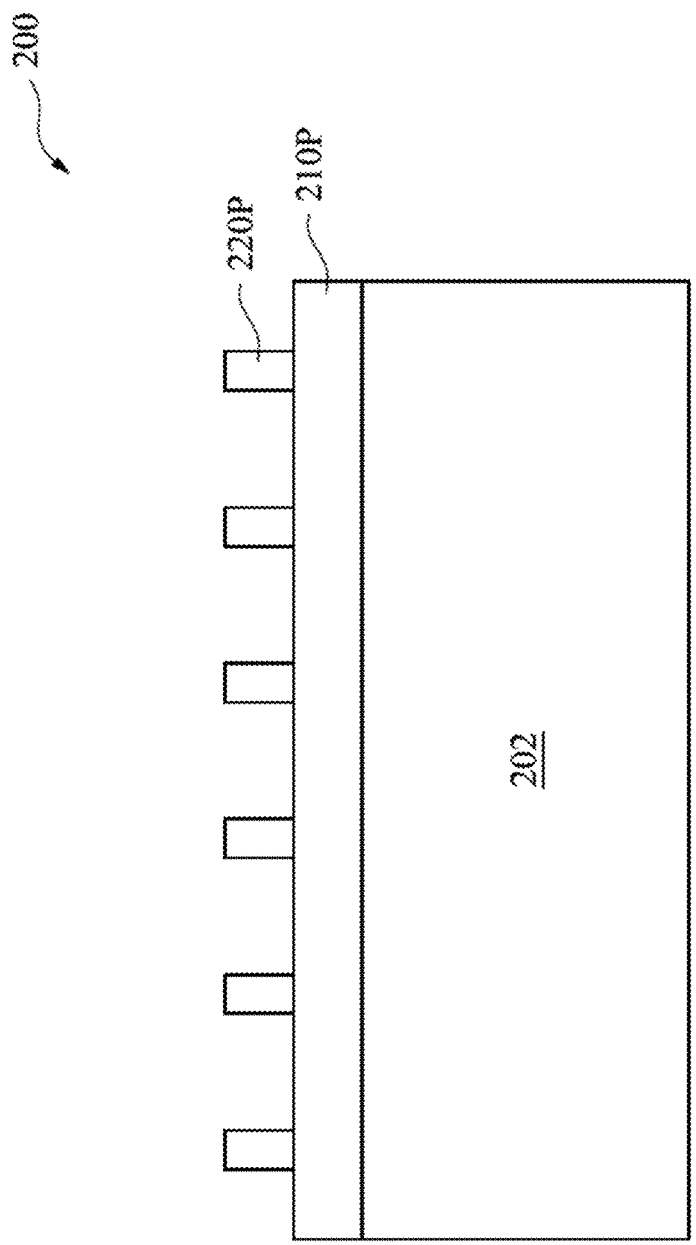

Referring to FIGS. 1 and 2G, the method 100 proceeds to operation 114, in which the middle material layer 220 is etched using the patterned photoresist layer 230P as an etch mask, in accordance with some embodiments. FIG. 2G is a cross-sectional view of the semiconductor device 200 of FIG. 2F after etching the middle material layer 220 using the patterned photoresist layer 230P as an etch mask.

Referring to FIG. 2G, the middle material layer 220 is etched, using the patterned photoresist layer 230P as an etch mask, to form a patterned middle material layer 220P. The etch can be a dry etch such as RIE or a wet etch. Etching of the middle material layer 220 exposes portions of the underlying bottom material layer 210. If not completely consumed during the etching process, after etching the middle material layer 220, the patterned photoresist layer 230P is removed by, for example, stripping or oxygen plasma.

Figure 2H:
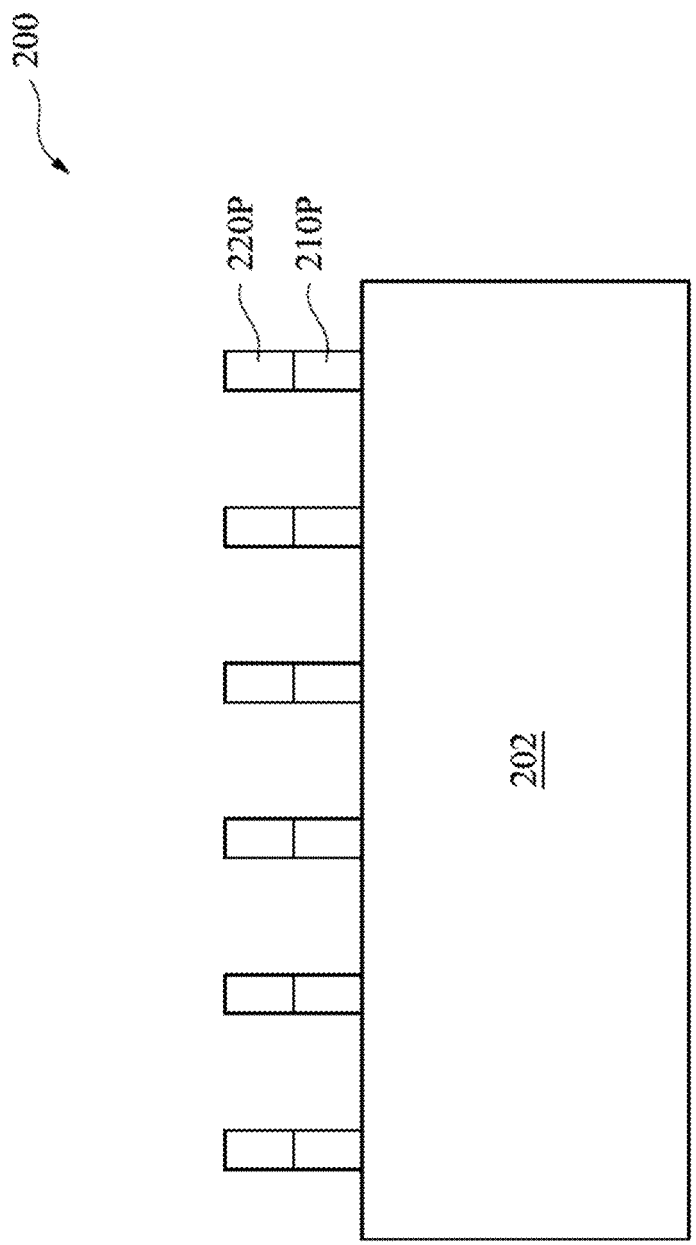

Referring to FIGS. 1 and 2H, the method 100 proceeds to operation 116, in which the bottom material layer 210 is etched using the patterned middle material layer 220P as an etch mask, in accordance with some embodiments. FIG. 2H is a cross-sectional view of the semiconductor device 200 of FIG. 2G after etching the bottom material layer 210 using the patterned middle material layer 220P as an etch mask.

Referring to FIG. 2H, the bottom material layer 210 is etched, using the patterned middle material layer 220P as an etch mask, to form a patterned bottom material layer 210P. Etching of the bottom material layer 210 exposes portions of the underlying substrate 202

An etching process may be performed to transfer the pattern in the patterned middle material layer 220P to the bottom material layer 210. In some embodiments, the etching process is an anisotropic etch such as a dry etch. In some embodiments, the dry etch is a RIE or a plasma etch.

One or more fabrication processes, such as an etching process or an implantation process, may be performed to the substrate 202 using the patterned middle material layer 220P and the patterned bottom material layer 210P as a mask.

One aspect of this description relates to a multilayer structure. The multilayer structure includes a substrate, a bottom anti-reflective coating (BARC) layer over the substrate and including a polymer and a hydrolysis promoting agent, and a photoresist layer over the BARC layer. The photoresist layer includes an organometallic dimer obtained by partial hydrolysis of a precursor organometallic compound represented by the formula $R_n\text{-M-L}_{4-n}$, wherein M is a metal selected from the group consisting of tin (Sn), antimony (Sb) and indium (In), R is an organic ligand with 1 to 30 carbon atoms bound to M with a metal-carbon bond, L is a hydrolysable ligand, and n is an integer of 1 or 2.

Another aspect of this description relates to method of forming a semiconductor device. The method includes forming a bottom anti-reflective coating (BARC) layer over a substrate. The BARC layer includes a polymer and a hydrolysis promoting agent capable of absorbing water from ambient atmosphere. Next, a photoresist layer is deposited over the BARC layer. The photoresist layer includes an organometallic dimer obtained by partial hydrolysis of a precursor organometallic compound represented by the formula $R_n$-M-$L_{4-n}$, wherein M is a metal selected from the group consisting of tin (Sn), antimony (Sb) and indium (In), R is an organic ligand with 1 to 30 carbon atoms bound to M with a metal-carbon bond, L is a hydrolysable ligand, and n is an integer of 1 or 2. Next, the photoresist layer is thermally cured, thereby causing hydrolysis of the organometallic dimer in the presence of water and subsequent condensation of the hydrolyzed organometallic dimer to form an organometallic oxide hydroxide cluster, wherein the hydrolysis promoting agent absorbs water from ambient atmosphere to cause the complete hydrolysis of organometallic dimer. Next, the photoresist layer is patterned to form a patterned photoresist layer. Next, the BARC layer is etched using the patterned photoresist layer as an etch mask.

Still another aspect of this description relates to a method of forming a semiconductor device. The method includes forming a first material layer over a substrate and then forming a second material layer over first material layer. The second material layer includes a polymer, a thermal acid generator and a hydrolysis promoting agent capable of reacting with the thermal acid generator to generate water. Next, a precursor solution is applied over the second material layer to form a photoresist layer. The precursor solution includes an organometallic dimer obtained by partial hydrolysis of a precursor organometallic compound represented by the formula $R_n$-M-$L_{4-n}$, wherein M is a metal selected from the group consisting of tin (Sn), antimony (Sb) and indium (In), R is an organic ligand with 1 to 30 carbon atoms bound to M with a metal-carbon bond, L is a hydrolysable ligand, and n is an integer of 1 or 2. Next, the photoresist layer is baked at an elevated temperature. The baking the photoresist layer results in hydrolysis of the organometallic dimer in the presence of water and subsequent condensation of the hydrolyzed organometallic dimer forming an organometallic oxide hydroxide cluster. The water is generated by the reaction of the hydrolysis promoting agent and the thermal acid generator. Next, the photoresist layer is exposed to a patterning radiation to form a patterned photoresist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multilayer structure, comprising:
  a substrate;
  a stack over the substrate for lithographically patterning the substrate, the stack comprising:
    a bottom anti-reflective coating (BARC) layer over the substrate, the BARC layer comprising a polymer and a hydrolysis promoting agent selected from the group consisting of toluidine, chlorobenzene and tetrachloroethane; and
    a photoresist layer over the BARC layer, the photoresist layer comprising an organometallic dimer obtained by partial hydrolysis of a precursor organometallic compound represented by the following formula:

$R_n$-M-$L_{4-n}$, wherein:
      M is a metal selected from the group consisting of tin (Sn), antimony (Sb) and indium (In);
      R is an organic ligand with 1 to 30 carbon atoms bound to M with a metal-carbon bond;
      L is a hydrolysable ligand; and
      n is an integer of 1 or 2,
    wherein the hydrolysis promoting agent is adapted to increase water content in the photoresist layer, thereby causing complete hydrolysis of the organometallic dimer to form an organometallic oxide hydroxide dodecamer cluster through condensation prior to patterning the photoresist layer.

2. The multilayer structure of claim 1, wherein the hydrolysis promoting agent has a boiling point greater than 180° C.

3. The multilayer structure of claim 2, wherein the high boiling point solvent is toluidine.

4. The multilayer structure of claim 1, wherein the BARC layer further comprises a surfactant, a quencher, a thermal acid or thermal base generator or combinations thereof.

5. The multilayer structure of claim 1, further comprising a planarization layer between the substrate and the BARC layer.

6. The multilayer structure of claim 5, wherein the planarization layer comprises spin-on carbon, diamond-like carbon, polyarylene ether or polyimide.

7. A multilayer stack for use in a lithography patterning process, comprising:
  a bottom material layer over a substrate, the bottom material layer comprising spin-on carbon, diamond-like carbon, polyarylene ether, or polyimide;
  a middle material layer over the bottom material layer, the middle material layer comprising a crosslinkable polymer comprising at least one cross-linkable pendant group attached to a polymer backbone and a diffusible molecule for absorbing water from ambient environment, the diffusible molecule represented by the following formula:

$R_1$—X, wherein:
    $R_1$ is an alkyl, cycloalkyl or aryl group; and
    X is a polar functional group selected from the group consisting of —I, —Br, —Cl, —SH, —$N_3$, imine, aldehyde, sulfone, cyanide and phosphite; and
  a photoresist layer over the middle material layer, the photoresist layer comprising an organometallic dimer obtained by partial hydrolysis of a precursor organometallic compound represented by the following formula:

$R_n$-M-$L_{4-n}$, wherein:
    M is a metal selected from the group consisting of tin (Sn), antimony (Sb) and indium (In);
    R is an organic ligand with 1 to 30 carbon atoms bound to M with a metal-carbon bond;

L is a hydrolysable ligand; and n is an integer of 1 or 2, wherein the hydrolysis promoting agent is adapted to increase water content in the photoresist layer, thereby causing complete hydrolysis of the organometallic dimer to form an organometallic oxide hydroxide dodecamer cluster through condensation prior to patterning the photoresist layer.

8. The multilayer stack of claim 7, wherein $R_1$ is methyl, ethyl, propyl, butyl, pentyl, hexyl, benzyl, phenethyl, naphthyl, phenoxy, methylphenoxy, dimethylphenoxy, ethylphenoxy or phenyloxy methyl.

9. The multilayer stack of claim 7, wherein the middle material layer further comprises a surfactant, a quencher or a combination thereof.

10. The multilayer stack of claim 7, wherein the precursor organometallic compound is n-butyltrichlorotin.

11. A multilayer stack for use in a lithography patterning process, comprising:

a planarization layer over a substrate;

a bottom anti-reflective coating (BARC) layer over the planarization layer, the BARC layer comprising a crosslinkable polymer comprising at least one crosslinkable pendant group attached to a polymer backbone, a hydrolysis promoting agent selected from the group consisting of trimethylolpropane and pentaerythritol and an acid generator; and a photoresist layer over the BARC layer, the photoresist layer comprising an organometallic dimer obtained by partial hydrolysis of a precursor organometallic compound represented by the following formula:

wherein:

M is a metal selected from the group consisting of tin (Sn), antimony (Sb) and indium (In);

R is an organic ligand with 1 to 30 carbon atoms bound to M with a metal-carbon bond;

L is a hydrolysable ligand; and n is an integer of 1 or 2, wherein the hydrolysis promoting agent is adapted to increase water content in the photoresist layer, thereby causing complete hydrolysis of the organometallic dimer to form an organometallic oxide hydroxide dodecamer cluster through condensation prior to patterning the photoresist layer.

12. The multilayer stack of claim 11, wherein the hydrolysis promoting agent comprises pentaerythritol.

13. The multilayer stack of claim 11, wherein the acid generator comprises 2,4,4,6-tetrabromocyclohexadienone, 2-hydroxyhexyl p-toluenesulfonate or 2-nitrophenyl tosylate.

14. The multilayer structure of claim 1, wherein the precursor organometallic compound comprises t-butyltrichlorotin, i-butyltrichlorotin, n-butyltrichlorotin, sec-butyltrichlorotin, ipropyltrichlorotin, n-propyltrichlorotin, t-butyltribomotin, i-butyltribomotin, nbutyltribomotin, sec-butyltribomotin, i-propyltribomotin or n-propyltribomotin.

15. The multilayer structure of claim 1, wherein the precursor organometallic compound is n-butyltrichlorotin ($C_4H_9SnCl_3$).

16. The multilayer structure of claim 1, wherein the polymer comprises a polymer backbone and a plurality of pendant groups bound to the polymer backbone, the plurality of pendant groups including a first pendant group comprising a crosslinkable functional group for crosslinking the polymer, a second pendant group comprising an aromatic group for absorbing light and a third pendant group comprising a cyclic group for enhancing adhesion of the BARC layer to the photoresist layer.

17. The multilayer structure of claim 16, wherein the crosslinkable functional group comprises epoxy or alkene.

18. The multilayer stack of claim 9, wherein the quencher is an organic amine or an organic acid.

19. The multilayer stack of claim 11, wherein the precursor organometallic compound comprises t-butyltrichlorotin, i-butyltrichlorotin, n-butyltrichlorotin, sec-butyltrichlorotin, ipropyltrichlorotin, n-propyltrichlorotin, t-butyltribomotin, i-butyltribomotin, nbutyltribomotin, sec-butyltribomotin, i-propyltribomotin or n-propyltribomotin.

20. The multilayer stack of claim 11, wherein the middle layer further comprises an anionic surfactant, a cationic surfactant or a nonionic surfactant.

* * * * *